United States Patent [19]

Fenk

[11] 4,150,344
[45] Apr. 17, 1979

[54] TUNABLE MICROWAVE OSCILLATOR

[75] Inventor: Josef Fenk, Ottenburg, Fed. Rep. of Germany

[73] Assignee: Siemens Aktiengesellschaft, Berlin & Munich, Fed. Rep. of Germany

[21] Appl. No.: 767,530

[22] Filed: Feb. 10, 1977

[30] Foreign Application Priority Data

Mar. 1, 1976 [DE] Fed. Rep. of Germany ....... 2608451
Jul. 9, 1976 [DE] Fed. Rep. of Germany ....... 2630992

[51] Int. Cl.² ............................................. H03B 5/18
[52] U.S. Cl. ................... 331/117 D; 325/451; 331/108 C
[58] Field of Search .......... 331/117 R, 117 D, 117 V, 331/108 C, 94, 115; 325/451

[56] References Cited

U.S. PATENT DOCUMENTS

| 3,284,723 | 11/1966 | Henkels | 331/115 |
| 3,391,351 | 7/1968 | Trent | 331/115 |
| 3,639,858 | 2/1972 | Miyata | 331/115 |
| 3,693,105 | 9/1972 | Kleinberg | 331/115 |
| 3,955,154 | 5/1976 | Sasaki et al. | 331/117 R |
| 4,010,428 | 3/1977 | Sunkler | 331/117 D |

FOREIGN PATENT DOCUMENTS 1140750 1/1969 United Kingdom .................... 331/117

OTHER PUBLICATIONS

Electronic Design, Aug. 2, 1965, pp. 20, 21.

Primary Examiner—John Kominski
Attorney, Agent, or Firm—Hill, Gross, Simpson, Van Santen, Steadman, Chiara & Simpson

[57] ABSTRACT

A tunable microwave oscillator including a transistor with a tuning diode which form an oscillating circuit particularly for use in television tuners and which does not require an inductor. A novel combination of an oscillator and mixer is also provided and the oscillator and mixer are designed to cover broad tuning ranges.

14 Claims, 10 Drawing Figures

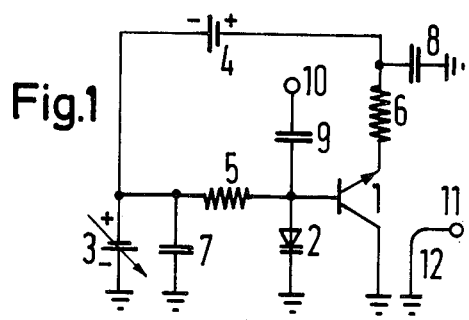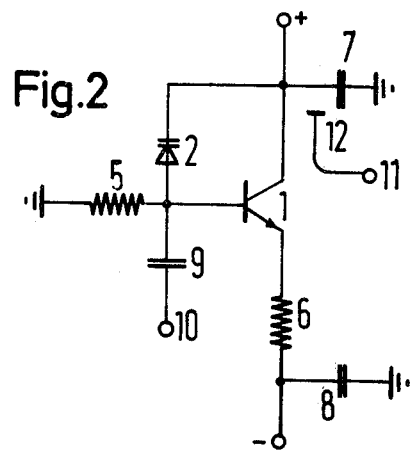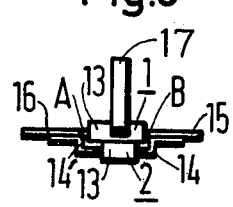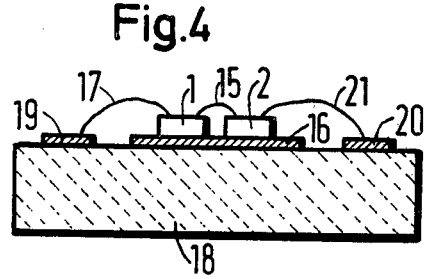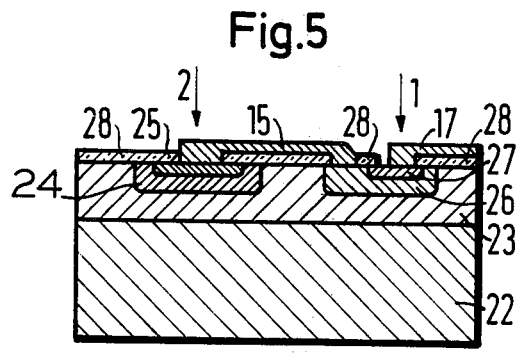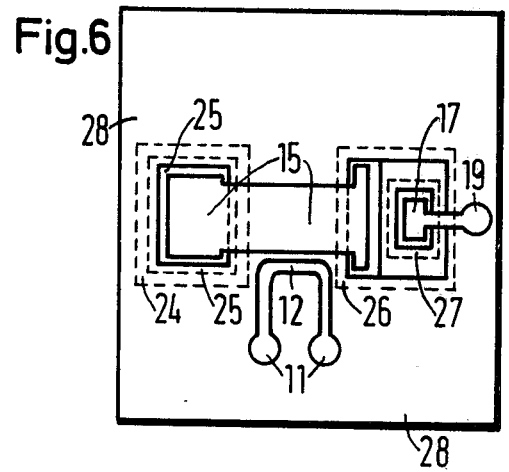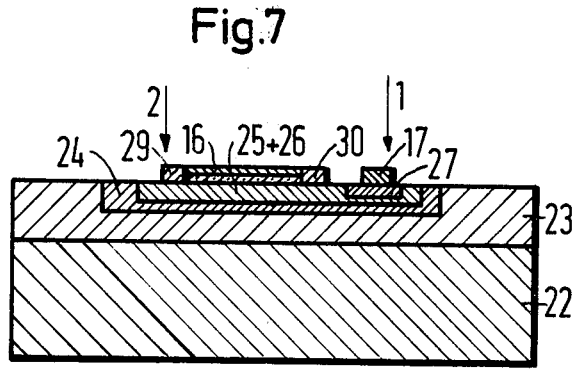

TUNABLE MICROWAVE OSCILLATOR

BACKGROUND OF THE INVENTION

1. Field of the Invention

The invention relates in general to tunable microwave oscillators and in particular to oscillators for television receivers.

2. Description of the Prior Art

Tuners of television receivers of the prior art generally are constructed as a combination of mechanical and electronic change-over switches and separate VHF and UHF converter components for receiving the entire television frequency range of bands I, band III and bands IV/V. In order to be able to receive the entire frequency range from 54 to 890 MHz (in U.S.) which comprises more than 4 octaves normally two separately tunable oscillators have been used. The VHF oscillator for band III is switched to a different frequency and used in band I with the use of an additional inductor. It is also known to simplify the arrangement by using double conversion with a high first intermediate frequency rather than the single conversion. In order to cover the entire frequency range, the first oscillator of the tuner must be tunable in the range greater than 1 GHz and must be tunable over a range $\Delta f$ of approximately 1 GHz.

The oscillators previously available for this frequency range have been very expensive and have been limited to frequency intervals of $f_{max}/f_{min}$ of approximately 1.5. The conventional technique has used transistor oscillators with YIG resonators as the frequency determining components. However, these oscillators cannot be constructed with monolithic integration techniques. Also, the expense of the peripheral circuits and the expensive mechanical construction and the associated high construction costs do not lend such circuits to television receiver tuners.

If the principle of double conversion is used and a first IF of 1 GHz is used in a television tuner an electrical oscillator which is fully tunable over a frequency range from 1 to 2 GHz is required in order to convert useful frequencies from 0 to 1 GHz into the television IF position of 36 MHz. Therefore, it is desirable to have an oscillator having a frequency tuning interval of $f_{max}:f_{min}$ greater than 2 as well as having adequate HF power.

SUMMARY OF THE INVENTION

According to the present invention an oscillator is provided which can be output coupled through a capacitor and/or through a counter inductance is constructed without the use of a coil and is formed by the base-collector path and a tuning diode with which the frequency of the oscillator can be varied by varying the voltage on the tuning diode.

In a preferred embodiment of the invention, the ratio of the capacitance of the tuning diode to the collector base capacitance of the transistor lies in the range from 2 to 3.5 and more particularly in the range from 2.5 to 3 and the overall capacitance is measured in Picofarads in the oscillator circuit and the overall inductance of the oscillating circuit is measured in nanohenrys and is formed merely by the transistor, the tuning diode and the interconnecting lines rather than with an induction coil and the overall capacitance to the overall inductance lies in the range from 3 to 4 (at an optimum of 3.5).

If the output coupling of the oscillator signal is inductively coupled, neither a coil or transformer winding is provided but merely a secondary conductor or a secondary circuit is arranged in the vicinity of the oscillating circuit such that it can be inductively coupled thereto.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIG. 1 is an electrical schematic of the novel oscillator of the invention;

FIG. 2 is a modified form of the oscillator;

FIG. 3 is a sectional view illustrating an embodiment of the invention;

FIG. 4 is a sectional view illustrating the transistor and diode mounted on an insulating disc shaped carrier;

FIG. 5 is an integrated circuit form of the invention;

FIG. 6 is a plan view of the integrated circuit illustrated in FIG. 5;

FIG. 7 illustrates a modified form of the invention;

DESCRIPTION OF THE PREFERRED EMBODIMENTS

Figure 8:
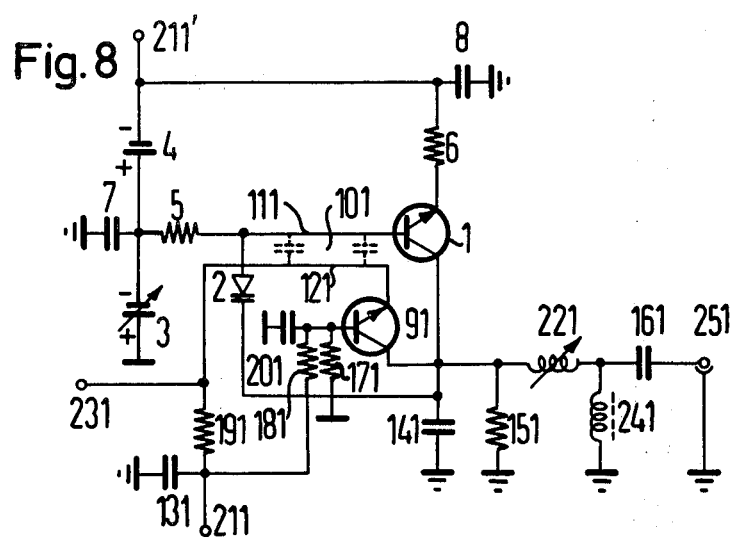
FIG. 8 is an electrical schematic of the oscillator and mixer of the invention.

FIG. 1 is a schematic illustration of the oscillator of the invention comprising atransistor 1 which might be a bipolar type npn which has a tuning diode 2 connected between the base and collector to form the oscillator. The oscillating circuit capacitance is the sum of the transistor base to collector capacitance $C_{BC}$ and the capacitance of the tuning diode 2 which can be varied. The oscillating circuit inductance is the sum of the inductance of the transistor 1 and the diode 2 and of the associated connecting lines.

For bias voltage a variable DC voltage source 3 can be adjusted to different voltage values and is connected between ground and through a resistor 5 to the anode of the diode 2 and to the base of the transistor 1. The voltage source 3 provides the operating voltage for the tuning diode which must be operated as a pn junction in the reverse direction. Since the cathode and collector of the diode and transistor 1 are connected to ground and the second terminal of the voltage source 3 is connected to ground a suitable variable bias can be applied by the source 3 to the diode 2 and the transistor 1. A fixed DC bias source 4 is connected between one terminal of the variable bias source 3 and a resistor 6 which has its other side connected to the emitter of transistor 1. The resistors 5 and 6 are selected so that they do not impair the quality of the oscillating circuit and in a particular example the resistance of these resistors was selected to be more than 1 kOhm and preferably in the range between 1.2 to 1.8 kOhm.

A capacitor 7 is connected parallel with the voltage source 3 and a capacitor 8 is connected between the junction point between the resistor 6 and the bias source 4 and ground and are selected such that they have small impedance to the oscillating frequency of the oscillator and, thus, provide shorting paths for the oscillating frequency to ground so that such oscillating frequencies will not be reflected into the bias sources 3 and 4. These capacitors have substantially infinite impedance to the DC voltage of the biasing sources 3 and 4 but prevent high frequency AC oscillations from being reflected into the bias sources 3 and 4. In a particular modification the value of these capacitors was selected at 1.5 nF (thus $10^{-9}$ As/V).

So as to remove the output oscillating signal from the oscillator, terminal 10 is provided which is coupled to the base of transistor 1 through the capacitor 9. Optionally, it is also possible to provide a terminal 11 which is purely inductively coupled to the oscillating circuit by a line portion 12 and the oscillating energy of the oscillator is transferred purely as results of the counter EMF induced from the oscillating circuit of the oscillator to the conductor 12. The capacitor 9 may have a capacitance value of 0.5 pF ($5 \cdot 10^{-13}$ As/V) and the length of the conductor 12 may be approximately 2 – 5 μm and its spacing from an adjacent part of the oscillating circuit can be as small as possible and might amount to approximately $10^{-6}$ meters which equals 10 μm for the integrated embodiment and might be 10 – 100 μm for the discrete embodiment but in any event should be as close as possible. The counter inductance might be approximately 2.5 nHy ($2.5 \cdot 10^{-9}$ Vs/A).

So as to obtain an effective oscillator which fulfills the above requirements, the magnitude of the base-collector capacitance of the transistor 1 which is the capacitance $C_{BC}$ and the magnitude of a particular one of the capacitive values which can be obtained with the tuning diode is of significance. Since no coils are provided in the oscillating circuit and it is desired to provide low loss construction only short interconnecting lines are used and the oscillating circuit inductance can be selected to have a maximum of 4 – 5 nHy (4 – 5 Vs/A, $10^{-9}$).

However, these dimensions largely determine the overall capacitance of the oscillating circuit which should have a maximum of no greater than 20 pF and preferably no greater than 10 pF. The overall capacitance of the oscillating circuit is basically formed from the sum of the base to collector capacitance $C_{BC}$ of the transistor 1 and of the set capacitance existing for the tuning diode 2. Additionally, the other operating capacitances of the transistor 1 such as the emitter base capacitance $C_{EB}$ and the emitter collector capacitance $C_{EC}$ form a part of the operating capacitance but a very small part.

It is desirable in the circuit illustrated in FIG. 1 to use a transistor type for the transistor 1 which has a capacitance $C_{CB}$ which is approximately 1.9 – 2 pF at a 10 volt operating voltage and which has a base to emitter capacitance $C_{BE}$ of approximately 10 pF and whose emitter collector capacitance $C_{EC}$ is not greater than 2 pF.

The tuning diode 2 can be a pn-junction diode or a Schottky type diode. In both cases, it is desirable that the diode possess an extremely abrupt UC curve. The capacitance interval should lie within the range of 4.5 – 6, the maximum capacitance $C_{max}$ should be approximately 18 pF at 1 volt and the minimum capacitance should be approximately 2 pF at 30 volts.

The transistor 1 can be a commercially available type BFT 12 having a $C_{BC}$ between 1.8 – 1.9 pF and a frequency $f_T$ of 23 GHz. The diode 2 can be type BB 105 which is an extremely abrupt capacitance diode.

FIG. 2 illustrates a modification of the oscillator illustrated in FIG. 1 in which only a single biasing source is required rather than the two biasing sources illustrated in FIG. 1. The single biasing source is connected with the positive terminal to the junction point between the diode 2 and the capacitor 7 and the negative terminal of the variable biasing source is connected to the junction point between the capacitor 8 and the resistor 6. The resistor 5 is connected between ground and base and the values of the illustrated components in FIG. 2 are similar to those components having the same numbers in FIG. 1.

In the oscillating circuit according to the invention which is preferably designed to operate over a frequency range from 1–2 GHz, the distributed oscillating circuit inductance consists merely of the parasitic inductances of the transistor 1 and the tuning diode 2 including the inductances of the required electrical connections whereas the oscillating circuit capacitance is divided between the capacitance of the tuning diode and the effective collector-base capacitance of the transistor. Therefore, a clearly negative input conductivity exists between the base and collector electrodes of the transistor 1 over the entire tuning range controlled by the variation range of the hyperabrupt varactor diode 1 of the oscillator according to the invention so that the oscillating condition always exists and the so-called oscillator jumping is avoided.

FIG. 3 illustrates a practical spatial arrangement of an oscillator according to the invention. The transistor 1 and tuning diode 2 are each embedded in insulating synthetic material 13. The common anode terminal 14 of the diode and the base terminal 15 of the transistor are connected together by welding and the cathode terminal 14' of the diode and the collector terminal 16 of the transistor are connected together as, for example, by welding. During construction attention must be paid to providing the exact dimensioning of the feed lines 14, 15, 14' and 16 to ensure that frequency shifts in the electrical characteristics of the oscillator do not occur as the result of the welding, as for example, from lumps of solder metal material which could cause such frequency shifts. After the connections of the leads have been accomplished, the overall arrangement can be embedded in synthetic material and a suitable synthetic material for this purpose and for casings may be selected from silicones and/or polyimides. It is desirable that only a few millimeters exist as the spacing of the effective contact points A and B between the terminals so that the free lengths of the connecting lines which contribute toward the oscillating circuit inductance will amount to only approximately 0.5 mm with a wire diameter of 0.9 × 0.16 μm. The emitter terminal is designated by 17.

The embodiment illustrated in FIG. 4 comprises an insulating disc shaped carrier consisting of ceramic for example, which has provided on its surface discrete metal layers 16, 19 and 20 that may comprise gold which has been vapor-deposited. The metallized layer 16 serves as an electrical connection between the cathode of the tuning diode 2 and the collector of the transistor 1 and these components are subsequently secured on the metal layer directly spaced short distances from each other. This is a particularly simple arrangement if the semiconductor diode 2 and the transistor 1 are produced in the conventional manner using planar techniques.

The connecting wire 15 which consists of, for example, gold wire extends from the base of the transistor 1 to the anode of the tuning diode 2 and establishes the single dc connection between the two elements 1 and 2 and also due to the geometrical arrangement practically exclusively determines the oscillating circuit inductance because the self-inductance of the layer 16 is virtually insignificant relative to that of the thin wire 15. For this reason, the length of the contacting wire 15 should be dimensioned in accordance with the L/C ratio required for the desired frequency range of the oscillator. Additional connecting wires 17 and 21 form the outer terminals to the emitter and collector of the transistor 1. These are directly connected to the metal areas 19 and 20 which serve as the outer terminals of the device.

The oscillator of the present invention can also be constructed using integrated circuit techniques and a particular integrated embodiment is illustrated in sectional view in FIG. 5 and in plan view in FIG. 6.

On the surface of a disc shaped monocrystalline silicon body 22 of the n-type having a specific resistivity of 0.01 $\Omega$/cm, a monocrystalline n-conducting layer 23 of n-type and having a specific resistivity of approximately 1 - 1.5 $\Omega$/cm is epitaxially deposited from a gas phase. The thickness of the layer 23 may be approximately 6 $\mu$m and the doping concentration of layer 23 may be n-conductivity at approximately $5 \cdot 10^{15}$ cm$^{-3}$. In order that a tuning diode can be produced with the desired capacitive range, it is formed with a superabrupt pn junction. For this purpose, the planar technique is used to produce both the diode 2 as well as the transistor 1 in the same layer 23 and the doping of the pn junction of the diode is accomplished in the known manner. For example, by diffusing donors using a suitable perforated SiO$_2$ and/or Si$_3$N$_4$ layer as a diffusion mask, it is possible to diffuse a strongly n-doped zone 24 which might have a phosphorous concentration on the surface of $7.10^{18}$ cm$^{-3}$ at the surface of zone 24 and a depth of 2 $\mu$m can be diffused into the epitaxial n-layer 23. Then a p+ zone 25 having a boron concentration of approximately $5 \cdot 10^{20}$ cm$^{-3}$ is diffused into the n+ zone 24. The zones 23, 24 and 25 form the superabrupt tuning diode 2. The substrate body 22 here serves as one terminal of the diode. The substrate body 22 also connects the cathode of the diode 2 to the collector of the transistor 1 which is also formed in the epitaxial n region 23.

The transistor 1 is produced a short distance from the diode 2 and for this purpose again using the planar technique a p-conducting base zone 26 having a boron concentration of approximately $5 \cdot 10^{17} - 10^{18}$ cm$^{-3}$ and a penetration depth of 0.4 $\mu$m is produced in the zone 23. This base zone forms the base zone 26 of the transistor and then an emitter zone 27 of n-type having a concentration of approximately $5 \cdot 10^{20}$ cm$^{-3}$ of donors which might be phosphorous or Sb and having a depth of 0.3 $\mu$m is produced. It is advisable to produce the junctions of the diode 2 by diffusion and those of the transistor 1 by ion implantation techniques.

The collector zone of the transistor 1 is formed by the original epitaxial zone 23 which simultaneously forms a zone of the tuning diode (the cathode). Therefore, due to the presence of the n+ conducting substrate 22, an extremely low inductive connection is made between the collector of the transistor 1 and the cathode of the tuning diode 2. Then the arrangement is covered with an insulating thin layer 28 which consists, for example, of SiO$_2$ and in which suitable windows required for providing the openings for attaching leads to the zones 25, 26 and 27 are etched into the layer of SiO$_2$ by means of the photolacquer etching techniques so that the surfaces of the zones 25, 26 and 28 are exposed at the desired positions of the electrical contacts and only at these positions. Then using conventional vapor deposition and etching techniques the electrical conductor path 15 which extends from zone 25 to zone 26 is produced and the electrical conducting path 17 which provides a terminal to zone 27 are formed. A generally U-shaped conducting path 12 is formed as shown in FIG. 6 and which is fully insulated from the semiconductor by layer 28 is provided with connection terminal points 11 at either end thereof and forms the conductor loop which serves to pick up the signal and which is spaced from the conducting path 15 by a few micrometers as, for example 5 - 10 $\mu$m. The conductor 12 runs partially parallel to the latter and is spaced a short distance therefrom so as to obtain desirable inductive and capacitive characteristics.

The metallized electrically conducting path 15 forms the connection between the base zone 26 of transistor 1 and the anode of the hyperabrupt tuning diode 2 and determines the inductance of the oscillating circuit of the oscillator. External connection 19 is electrically connected to the emitter by terminal 17 and an external connection is connected to the substrate 22.

The inductance of the oscillating circuit is determined by both the length of the electrically conducting path 15 as well as its current conducting cross-section. Since the oscillating circuit inductance is desired to be only a 4 - 5 nHy, in the embodiments of the invention, in order to achieve the desired frequency range the length of the conductor 15 and thus the space between the diode 2 and the base of the transistor 1 is determined according to the following principles. In the event that the connection line 15 is rectilinear and has a virtually homogeneous cross-section, the resulting inductance L will be determined according to the following formula.

$$L = \mu_o \cdot 1/q$$

and $$1 = L\,q : \mu_o$$

where L is the self-inductive coefficient, q is the cross-section of the conductor 15 and $\mu_o$ is the magnetic permeability which is known to have a value of $1.256 \cdot 10^{-6}$V.s/Am. In this manner, it is possible to calculate 1 and thus also the shortest distance between the tuning diode 2 and the transistor 1 which corresponds approximately to 1 for a given cross-section q of the electrical conducting path 15.

FIG. 7 illustrates an integrated circuit arrangement which is similar to FIG. 5. In this arrangement, the base zone of the transistor 1 is integrated with the anode zone of the tuning diode 2 and thus the regions 25 and 26 illustrated in FIG. 5 are integrated into a single layer indicated by 25 plus 26 in FIG. 7. The collector of the transistor 1 is formed as a single zone with the strongly doped n+ doped zone of the diode 2. Thus, the zones 25 and 26 have uniformity of doping and the zone 24 and collector of the transistor on the other hand have uniformity of doping.

The anode terminal of the diode 2 is indicated by 29 and the base terminal of the transistor 1 is indicated by 30. Both the anode 29 and the base 30 are connected to an outer electrical conductor 16 having the required inductance of 4 – 5 nHy. Since the electrical conducting path 16 consists of metal and therefore possesses a considerably higher electrical conductivity then the combined base-anode zone, the oscillating circuit is primarily formed by the zone 24 and the electrical conducting path 16.

It should also be noted that the tuning diode can also be a Schottky diode. For this embodiment, in an arrangement similar to FIG. 5, the zone 25 is replaced by a metal layer which forms a Schottky boundary layer with the n+ conducting zone 24. It is also possible that in place of hyperabrupt tuning diodes of the nn+p type and transistors of the npn type it is possible to combine diodes of the pp+n type with transistors of pnp type.

A further advantage of the microwave oscillator according to the invention is that it can be combined with a mixer stage wherein a monolithic integrated connection of the mixer to the microwave oscillator is accomplished.

This further development consists in coupling the collector of the microwave oscillator to a mixer stage which receives an input signal and wherein an intermediate frequency stage follows the mixer. The mixer stage can be in the form of an additional transistor which has its collector connected to the collector of the microwave oscillator transistor with an electrical conductor and both transistors may have their collectors connected to a shunt capacitor which is low-ohmic for the oscillator frequency but is high-ohmic for the intermediate frequency and operates in the collector-base circuits of the two transistors.

The term "self-oscillating mixer" refers to circuit arrangements in which an oscillator is simultaneously used as a mixer. This principle can also be used in the tunable microwave oscillator described above. Thus, for example, in the circuits illustrated in FIGS. 1 and 2, the terminals indicated by 10 can be used for supplying output signals and the terminals designated by 11 and 12 can be connected to an intermediate frequency oscillating circuit.

However, such circuit arrangement does not have adequate large signal properties in all cases so that in many situations such as in television tuners the use of an externally control mixer has proved superior. This allows each element of the arrangement to be individually optimized.

The invention and the advantages which it achieves using the mixer will be described in detail relative to FIGS. 8, 9 and 10.

In FIG. 8, the invention is illustrated as a bipolar transistor 1 which might be npn type and a tuning diode 2 is connected between the base and collector of transistor 1 so as to provide an oscillating circuit such as a microwave oscillator described relative to FIG. 1. The oscillating circuit capacitance in this circuit comprises the transistor base to collector capacitance $C_{BC}$ and the set capacitance of the tuning diode 2 which is established with the bias voltage 3 through the resistor 5 which is connected to the diode 2 and the base of the transistor 1. The oscillating circuit inductance comprises the sum of the inductance of the transistor 1 and the diode 2 plus the inductance of the associated electrical connecting lines.

A second bias voltage 4 is connected from the bias voltage 3 to a resistor 6 which has its other side connected to the emitter of transistor 1. The DC voltage 3 is variable and can be set to various voltages so as to tune the microwave oscillator and supply the collector-base voltage for the transistor 1 as well as the operating voltage for the tuning diode 2. The tuning diode 2 is operated as a pn junction in the reverse direction. The base electrode of the transistor 1 and one terminal of the diode 2 are connected to one terminal of the variable bias voltage 3 so as to change the tunable frequency of the microwave oscillator and the second terminal of the diode and the collector of the transistor 1 are connected to the second terminal of the DC voltage source 3 through ground through the inductors 221 and 241 which do not provide any substantial impedance to DC voltages. These inductors also provide protection for the transistor 1 and the transistor 91 of the mixer.

The fixed DC voltage 4 is connected between the junction point between the resistor 5 and the bias voltage 3 and a resistor 6 which has its other side connected to the emitter of transistor 1 and therefore it is effective to provide base emitter bias for the transistor 1. The resistors 5 and 6 are selected such that they do not unfavorably effect the efficiency of the oscillating circuit and their resistance values could, for example, be in the range from 1.2 to 1.8 kOhm.

A capacitor 7 is connected between the junction point between the bias sources 3 and 4 and ground and a capacitor 8 is connected between the connection point between resistor 6 and the bias source 4 and ground and they provide short circuit paths for oscillating frequencies to ground so as to protect the bias voltage sources 3 and 4. The capacitance values for the capacitors 7 and 8 may be, for example 1.5 nF ($10^{-9}$ As/V).

The oscillating signal appearing on the base lead 111 of the transistor 1 is coupled by coupling 101 to an electrical conducting lead 121 which is mounted adjacent the conductor 111. One end of the conductor 121 is connected to the emitter of a mixer transistor 91 and the other end is connected to an input terminal 231 to which an input mixing signal can be applied. It is to be realized, of course, that the circuit associated with the mixer can be formed in integrated circuit form as illustrated relative to the oscillator in FIGS. 5 and 6, for example.

The signals to be mixed with the output of the oscillator frequency are supplied at input terminal 231 through the line 121 to the emitter of transistor 91 and from ground through the capacitor 201 connected between ground and the base of the transistor 91 of the mixer.

The operating bias voltage can be connected to terminal 211 and through resistor 191 to the emitter of transistor 91. Terminal 211 is also connected through a resistor 181 to the base of transistor 91 and a capacitor 131 is connected between terminal 211 and ground. A base resistor 171 is connected between base and ground as shown.

The transistor 91 is selected to have similar characteristics to transistor 1 of the oscillator stage and if the transistor 1 is a npn transistor than the transistor 91 is selected to be a npn transistor.

Otherwise, the two transistors 1 and 91 are each selected and placed in a circuit designed according to their particular functions. Thus, the transistor 1 is trimmed so as to exhibit optimum oscillator properties and thus a circuit with good oscillatory stability over the entire frequency range of the oscillator and also having sufficient power generated for supplying to the mixer stage is required for the transistor 1 and its associated circuitry. The mixer circuit including the oscillator 91 is trimmed to exhibit optimum mixing characteristics and to have a small emitter-base capacitance.

The resistors 171, 181 and 191 with the bias voltage attached to terminal 211 supply the bias voltages for the emitter and base of the transistor 91.

The base terminal of transistor 91 can be fed from an additional DC voltage source connected between ground and terminal 211, however, as indicated in FIG. 8 it is possible to utilize the voltage source 4 to supply the emitter-base voltage of the transistor 1 as well as to supply the emitter circuit of the mixer 91 by connecting the negative terminal of voltage source 4 which is designated 211' to terminal 211 for this purpose.

The capacitor 201 connects the base of transistor 91 to ground for high frequencies and allows the transistor 91 to operate in a base connection. The capacitor 201 should have a value of about 470 pF (470 $10^{-12}$As/V). The function of the shunt capacitor 141 connected between the collectors of transistors 1 and 91 and ground is to form the intermediate frequency oscillating circuit with the inductor coils 221 and a capacitor 161 which is connected to the other side of the inductor 221 and to terminal 251. The capacitor 141 also serves to shunt the oscillator frequency to ground and it has a value such that although the high frequency oscillator signal is shunted to ground the intermediate frequency as, for example, 35 MHz is blocked and is provided to the output terminal 251. The capacitor 141 may have a capacitive value of 8.2 pF and the capacitance of the capacitor 161 may be 2.2 nF. The inductance value of the oscillating circuit coil 221 may be 190 to 400 nHy (1.9 - 4 $10^{-7}$Vs/A). The shunt choke 241 may have a value of 4.5 $\mu$Hy (4.5 $10^{-7}$Vs/A). The function of the fixed resistance 151 is to determine the band width in the IF circuit and it may be selected to have a value of 6.8 kOhms.

The resistor 171 which may have a value of 8.2 kOhm is to supply the base voltage to the transistor 91. The resistor 181 also serves to supply bias to the base of transistor 91 and is selected to have a value of, for example, 3.9 kOhm. The resistor 191 which limits the emitter current in a particular example had a value of 680 ohm. The blocking capacitor 131 was selected to have a capacitance value of 100 nF.

So as to feed the mixer of transistor 91 with the output of the oscillator transistor 1, an adequate coupling between the base-collector circuit of the oscillator transistor 1 and the emitter-base circuit of the mixer 91 must be ensured. For this purpose, the electrical line portions 111 and 121 of the two circuits are mounted so that they extend parallel to each other and spaced a relatively narrow distance apart so as to ensure adequate capacity coupling indicated by 101 and inductive coupling of the two circuits. Alternatively, an extra capacitor may be connected between the leads 111 and 121. The particular spacing and dimensions of these conductors will depend upon the noise and modulation properties of the transistor 91 and can be achieved as indicated in FIG. 10 by conductor paths formed on the surface of a monolithic integrated circuit embodiment.

In Summary, the microwave oscillator comprises the transistor 1, the diode 2 and the capacitor 141 and the mixer comprises the transistor 91. The mixer supply voltage is connected across the terminal 211 and can be supplied from terminal 211' of the voltage source 4. The operating point of transistor 91 is established by choosing the values of resistors 171, 181 and 191. The shunt capacitance 141 comprises a short circuit for the oscillator signal. The IF signal is filtered by the capacitor 141, the resistor 151, the inductor 221 and the capacitor 161. The supply choke 241 connects the collector terminals of the two transistors 1 and 91 to ground. The input signal which is to be analyzed can be input coupled to the terminal 231. The coupling between the leads 111 and 121 provide the oscillator frequency coupling to the emitter of mixer transistor 191.

Figure 9:
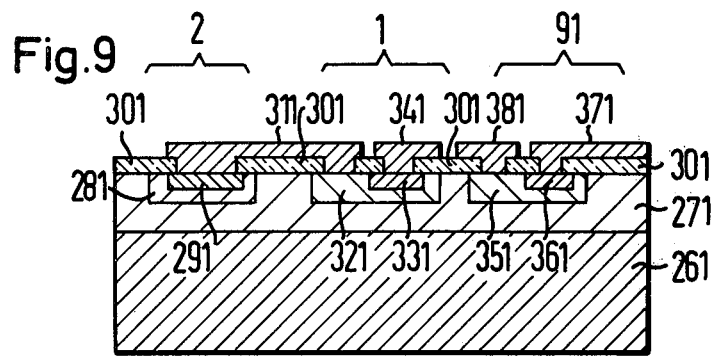
FIG. 9 is a sectional view through an integrated circuit formed according to the schematic diagram of FIG. 8.
Figure 10:
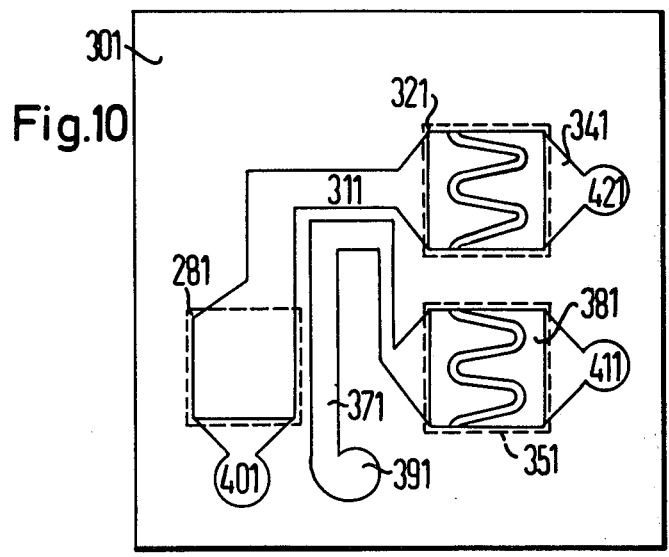
FIG. 10 is a plan view of the integrated circuit illustrated in FIG. 9.

The embodiments illustrated in FIGS. 9 and 10 represent an integrated circuit arrangement of the transistors 1 and 91 and of the tuning diode 2. These components are formed on the n- or a p- type conducting epitaxial monocrystalline layer 271 which is produced on the surface of a highly doped silicon crystal 261 of the same conductivity type. The tuning diode 2 consists of the zone 271, the adjoining zone 281 of the same conductivity type but of weaker doping and of a highly doped zone 291 of opposite conductivity type formed in zone 281. For the diode the one terminal is contacted by way of the substrate 261 which is connected to the zone 271 and the other terminal of the diode is arranged on an insulating layer 301 which might be of silicon dioxide $SiO_2$ which covers the surface of the arrangement except for the windows through which the electrical conductor extends as shown. The diode is formed as an abrupt or hyper abrupt tuning diode 2.

The oscillator transistor 1 consists of the region 271 which forms the collector of the transistor, a base zone of opposite conductivity to the zone 271 and which is formed in the zone 271 and an emitter zone 331 of the same conductivity type as the zone 271. The base zone 321 has a conductivity type which is opposite to that of zones 261, 271 and 281. For example, if zones 261, 271 and 281 are n type the base zone 321 of the transistor 1 will be p type and the emitter zone 331 will be n type. The mixer transistor 91 is formed in the zone 271 with the zone 271 forming the collector and a zone of opposite conductivity type 351 is formed in the zone 271 and is of opposite conductivity type to zone 271. The zone 351 forms the base of the mixer transistor 191 and an emitter 361 is formed in the zone 351 and is of the same conductivity type as the zone 271. The electrical conductors 311, 341, 381 and 371 are arranged so as to provide the appropriate electrical connections between the transistors and diode. The conductor path 311, for example, conducts the diode zone 291 of the diode 2 to the base zone 321 of the oscillator transistor 1. The conductor path 341 contacts the emitter zone 331 of the transistor 1. The conductor path 381 contacts the base zone 351 of the mixer transistor 91 and the conductor path 371 serves for coupling with the oscillator circuit and for contacting the emitter zone 361 of the transistor 91.

FIG. 10 is a plan view of the arrangement of FIG. 9 and a silicon dioxide layer 301 is illustrated with the electrical conductors 311, 341, 381 and 371 shown in plan view. The outlines of zones 281, 321 and 351 which are initially formed in the epitaxial layer 271 by corresponding mass diffusion of dopants are indicated in broken lines and correspond to the diode 2, the oscillator transistor 1 and the mixer transistor 91, respectively. An electrical connecting point 401 is connected to conductor 311 as shown. Electrical conducting point 421 is connected to conducting path 341 and thus to the emitter 331 of the oscillator transistor 1. A conducting point 411 is connected to conductor path 381 and thus to the base zone 351 of the mixer transistor 91.

The conducting lines 311 and 371 correspond to lines 111 and 121 illustrated in FIG. 8 with line 311 in the base-collector circuit of the oscillator transistor 1 and conductor 371 in the emitter-base circuit of the mixer 91. They extend a short interval, as for example, 5 - 20 μm parallel to each other over a longer distance as, for example, a length of 50 - 300 μm. Coupling capacitances of approximately 1 pF and coupling inductances of approximately 50 nHy result.

Further components of the circuit such as resistors and capacitors can possibly be constructed in the semiconductor technique and connected in the circuit illustrated in FIGS. 9 and 10.

In summary, relative to FIGS. 9 and 10, the zone 261 is strongly doped as, for example $n^+$ conducting substrate material and arranged on substrate material 261 is a considerably weaker doped epitaxial zone 271 having the same conductivity type as a substrate. In the epitaxial zone 271 the diode 2 comprising the zones 271, 281 and 291 is formed. The oscillator transistor comprises the zones 271, 321 and 331 and the mixer transistor 91 comprises the zones 271, 351 and 361 and these zones are produced by mass diffusion and ion implantation techniques.

The base of oscillator transistor 1 is connected with connection line 311 to the anode of the tuning diode 2. The connecting line 311 serves as the oscillating circuit inductance for the oscillator. The input signal is applied to terminal 371 to the emitter of the mixer transistor 91 and the supply current is also supplied at this terminal. The oscillator signal is input coupled by connecting line 371 to the mixer. The emitter 361 of the mixer transistor 91 is in the form of a diffused emitter. Due to the absence of minority carriers an emitter in the form of a Schottky contact can operate even more favorable since this results in an increased and mixing efficiency. The mixer transistor is dimensioned such that it exhibits adequate amplification for the desired IF output. The input path 371 of the mixer 91 should, however, possess as few possible parasitic circuit elements and a minimum storage times as possible. In particular capacitances which are parallel to the base-emitter path are to be avoided as this impairs the control characteristics of the base emitter path.

A device according to the invention can be used particularly as a tuner in television receivers as well as in so-called spectrum analyzers as well as in all applications in the microwave range in which a large frequency range over one octave must be accommodated.

Although this invention has been described with respect to preferred embodiments, it is not to be so limited, as changes and modifications may be made which are within the full intended scope as defined by the appended claims.

1. A tunable microwave oscillator comprising a transistor (1), a tuning diode (2), a first impedance (5) connected between the base of the transistor (1) and one terminal of a variable DC voltage source (3) which provides a base potential, the collector of said transistor connected to the other terminal of said variable DC voltage source (3) which forms a collector potential, said diode connected across the collector-base-pn-junction of said transistor (1) such that said diode and the diode of said base-collector junction of said transistor are in blocking direction, said variable DC voltage soure (3) supplying the collector-base current and a first capacitor (7) in parallel therewith, the emitter of said transistor (1) connected to one terminal of a second DC voltage source (4) which forms the emitter potential through an emitter second impedance (6), and the other terminal of said second DC voltage (4) is connected to the base of the transistor (1) through said first impedance (5), said one terminal of the second DC voltage (4) supplying the emitter potential is connected to the collector of said transistor (1) through a second capacitor (8), and the base-collector circuit of said transistor (1) is connected to the signal output terminal of the microwave oscillator by a third capacitor (9) or a counterinductance (12).

2. A tunable microwave oscillator according to claim 1 wherein the ratio of the capacitance of said tuning diode to the collector-base capacitance of the transistor is in the range from 2 to 3.5.

3. A tunable microwave oscillator according to claim 2 wherein the ratio of the overall capacitance of the oscillator circuit to the inductance, of the oscillating circuit lies in the range from 3 to 4.

4. A tunable microwave oscillator according to claim 1 wherein said transistor and said tuning diode are mounted in a synthetic plastic casing, and the collector supply line of said transistor is connected to the cathode supply line of said tuning diode and the base supply line of said transistor is connected to the anode supply line of said tuning diode.

5. A tunable microwave oscillator according to claim 1 wherein the dimensions of the electrical connecting lines and the dimensions of said transistor and said tuning diode are such that the resultant oscillating circuit inductance lies in the range from 4 - 5 nHy.

6. A tunable microwave oscillator according to claim 1 including an insulating base member and said transistor is secuted by its collector and said tuning diode by its cathode on a metal layer on said insulating base member and said collector and cathode conductively connected to one another by said metal layer, an additional connection line provided between the base of said transistor and the anode of said tuning diode, and the dimensions of said additional connection line relative to those of said metal layer being such that the inductance of the resultant oscillating circuit is determined virtually only by said additional connection line.

7. A tunable microwave oscillator according to claim 1 wherein said tuning diode is a hyperabrupt semiconductor diode of the pn type.

8. A tunable microwave oscillator according to claim 1 wherein said tuning diode and said transistor are constructed in a common monocrystalline semiconductor body of silicon.

9. A tunable microwave oscillator according to claim 8, wherein said tuning diode is formed in a high-ohmic, epitaxially deposited, monocrystalline silicon layer of one conductivity type which is epitaxially deposited on a low-ohmic silicon crystal of the same conductivity type.

10. A tunable microwave oscillator according to claim 9, wherein said tuning diode is in the form of a hyperabrupt diode formed by injecting into the epitaxial layer a very strongly doped trough shaped zone of the same conductive type and in said trough shaped zone is formed a smaller zone of opposite conductivity type as the anode of said diode.

11. A tunable microwave oscillator according to claim 9 wherein said transistor is formed as a planar transistor in said semiconductor body of silicon with said epitaxially deposited layer forming the collector of said transistor.

12. A tunable microwave oscillator according to claim 9 wherein said transistor is a planar transistor in which the collector zone forms a common zone with the strongly doped cathode zone of said hyperabrupt tuning diode.

13. A tunable microwave oscillator according to claim 12 wherein the base zone of said transistor and the anode zone of said hyperabrupt diode are formed of a single common zone, a first base electrode on the surface of said single zone, an emitter zone formed in said base, and a second anode electrode and an electrical conductor path connecting said base and anode electrodes and insulated from the semiconductor, and said electrical conductor path having a conductivity which is substantially smaller than and whose inductance is noticeably greater then that of the common anode base zone.

14. A tunable microwave oscillator according to claim 1 wherein said tuning diode is a hyperabrupt semiconductor diode of the Schottky type.

* * * * *